(12) United States Patent
Okuno et al.

(10) Patent No.: US 9,502,239 B2
(45) Date of Patent: Nov. 22, 2016

(54) SUBSTRATE PROCESSING METHOD, SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicants: HITACHI KOKUSAI ELECTRIC INC., Tokyo (JP); AZ ELECTRONIC MATERIALS (LUXEMBOURG) S.a.r.I., Luxembourg (LU)

(72) Inventors: Masahisa Okuno, Toyama (JP); Tooru Kakuda, Toyama (JP); Hideto Tateno, Toyama (JP); Takuya Joda, Toyama (JP); Masamichi Kurokawa, Kakegawa (JP)

(73) Assignees: HITACHI KOKUSAI ELECTRIC INC., Tokyo (JP); AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/707,350

(22) Filed: May 8, 2015

(65) Prior Publication Data

US 2015/0262817 A1    Sep. 17, 2015

Related U.S. Application Data

(63) Continuation of application No. PCT/JP2014/069826, filed on Jul. 28, 2014.

(30) Foreign Application Priority Data

Jul. 31, 2013   (JP) ................................ 2013-159667

(51) Int. Cl.
*H01L 21/20* (2006.01)
*H01L 21/02* (2006.01)
(Continued)

(52) U.S. Cl.
CPC ..... *H01L 21/02323* (2013.01); *C23C 16/4481* (2013.01); *C23C 16/46* (2013.01);
(Continued)

(58) Field of Classification Search
CPC ............... H01L 21/02; H01L 21/0212; H01L 21/02203; H01L 21/312; H01L 21/316; H01L 21/3127; H01L 21/70; H01L 21/768
USPC ........................................................ 438/15
See application file for complete search history.

(56) References Cited

U.S. PATENT DOCUMENTS 5,928,791 A * 7/1999 Rosenmayer .......... B05D 3/007
257/E21.241

(Continued)

FOREIGN PATENT DOCUMENTS

| JP | 2008-140896 A | 6/2008 |
| JP | 2012-060000 A | 3/2012 |
| WO | 2013/077321 A1 | 5/2013 |

OTHER PUBLICATIONS

Feb. 2, 2016 International Preliminary Report on Patentability issued in International Application No. PCT/JP2014/069826.

*Primary Examiner* — Michael Lebentritt
(74) *Attorney, Agent, or Firm* — Oliff PLC

(57) ABSTRACT

There is provided a substrate processing method, including: (a) loading a substrate into a processing vessel having a pre-baked film containing a silazane bond; (b) heating the substrate to a first temperature and supplying a process gas to the heated substrate; and (c) heating the substrate to which the process gas has been supplied, to a second temperature which is higher than the first temperature and less than or equal to a temperature at which the pre-bake has been performed.

5 Claims, 7 Drawing Sheets

(51) Int. Cl.
*H01L 21/67* (2006.01)
*C23C 16/448* (2006.01)
*C23C 16/46* (2006.01)
*C23C 16/52* (2006.01)

(52) U.S. Cl.
CPC ........ *C23C 16/52* (2013.01); *H01L 21/02126* (2013.01); *H01L 21/02164* (2013.01); *H01L 21/02222* (2013.01); *H01L 21/02269* (2013.01); *H01L 21/02326* (2013.01); *H01L 21/67034* (2013.01); *H01L 21/67109* (2013.01)

(56) References Cited

U.S. PATENT DOCUMENTS

| | | | |
|---|---|---|---|
| 6,455,934 B1 * | 9/2002 | Pasch ................. | H01L 21/3127 257/753 |
| 6,486,078 B1 * | 11/2002 | Rangarajan ......... | H01L 21/0212 257/E21.273 |
| 6,852,648 B2 * | 2/2005 | Nalamasu ............ | C08G 77/442 257/E21.259 |
| 7,842,390 B2 * | 11/2010 | Chung ................. | C08F 214/22 252/519.34 |
| 2012/0060752 A1 | 3/2012 | Kiyotoshi et al. | |

* cited by examiner

SUBSTRATE PROCESSING METHOD, SUBSTRATE PROCESSING APPARATUS, METHOD OF MANUFACTURING SEMICONDUCTOR DEVICE AND NON-TRANSITORY COMPUTER-READABLE RECORDING MEDIUM

BACKGROUND

Technical Field

The present invention relates to a substrate processing method, a substrate processing apparatus, a method of manufacturing a semiconductor device and a non-transitory computer-readable recording medium.

Description of Related Art

Technical difficulties have been increased in a processing technique of controlling a leakage current interference between transistor devices, with miniaturization of a large-scale integrated circuit (Large Scale Integrated Circuit: called simply LSI hereafter). Elements in the LSI are isolated by a method of forming a gap such as a groove or a hole, between the elements to be separated which are provided adjacent to each other on a silicon (Si) as a substrate, and depositing an insulating material in this gap. An oxide film is frequently used as the insulating material, and for example, a silicon oxide film (SiO film) is used.

The SiO film can be formed by oxidation of a Si substrate itself, Chemical Vapor Deposition (CVD method), or Spin On Dielectric (SOD method), etc.

With a progress of miniaturization of recent years, when oxide is embedded into a fine structure, and particularly when oxide is embedded into a gap structure deep in a vertical direction and narrow in a horizontal direction, an embedding method by CVD has a technical limit. Under such a circumstance, an embedding method using an oxide having fluidity, that is, using an SOD method, has been more frequently employed. In the SOD method, a coating insulating material containing an inorganic or organic component called SOG (Spin On Glass) is used. Although this material is employed in the manufacturing step of LSI prior to emergence of a CVD oxide film, a processing size is simply about 0.35 μm to 1 μm according to a processing technique using the SOD method. In order to realize the miniaturization, a reforming step of applying heat treatment of about 400° C. in a nitrogen atmosphere for example, is performed after coating of this material.

SUMMARY

Problem to be Solved by the Invention

However, in recent years, a minimal processing size of a semiconductor device represented by LSI, DRAM (Dynamic Random Access Memory), and Flash Memory, has been smaller than 30 nm width. Therefore, in the case of using the SOD method, the miniaturization while maintaining a quality, improvement of a manufacturing throughput, and realizing a lower processing temperature, are the subject of the invention.

An object of the present invention is to provide a technique capable of improving a property of a film formed on a substrate, and improving a manufacturing throughput.

SUMMARY OF THE INVENTION

According to an aspect of the present invention, there is provided a substrate processing method, including:

(a) loading a substrate into a processing vessel having a pre-baked film containing a silazane bond;

(b) heating the substrate to a first temperature and supplying a process gas to the heated substrate; and (c) heating the substrate to which the process gas has been supplied, to a second temperature which is higher than the first temperature and less than or equal to a temperature at which the pre-bake has been performed.

According to another aspect of the present invention, there is provided a substrate processing apparatus, including:

a processing vessel accommodating a substrate having a pre-baked film containing a silazane bond;

a process gas supplying unit supplying a process gas to the substrate;

a heating unit heating the substrate;

a control unit configured to control the process gas supplying unit and the heating unit to modify the pre-baked film containing a silazane bond by heating the substrate to a first temperature and supplying the process gas to the heated substrate and subsequently heat the substrate to a second temperature which is higher than the first temperature and less than or equal to a temperature at which the pre-bake has been performed.

According to further another aspect of the present invention, there is provided a method of manufacturing a semiconductor device, including:

(a) loading a substrate into a processing vessel having a pre-baked film containing a silazane bond;

(b) heating the substrate to a first temperature and supplying a process gas to the heated substrate; and (c) heating the substrate to a second temperature which is higher than the first temperature and less than or equal to a temperature at which the pre-bake has been performed.

According to further other aspect of the present invention, there is provided a non-transitory computer-readable recording medium recording a program for causing a computer to execute:

a procedure of loading a substrate into a processing vessel having a pre-baked film containing a silazane bond;

a procedure of heating the substrate to a first temperature and supplying a process gas to the heated substrate; and a procedure of heating the substrate to which the process gas has been supplied, to a second temperature which is higher than the first temperature and less than or equal to a temperature at which the pre-bake has been performed.

According to the present invention, properties of a film formed on a substrate can be improved, and a manufacturing throughput can be improved.

DETAILED DESCRIPTION OF THE INVENTION

Knowledge obtained by inventors of the present invention will be described first.

The following subject is found by the inventors of the present invention: a plurality of foreign matters (particles) are generated and are adhered on the substrate after processing the substrate, when the film containing a silazane bond (≡Si—N═ bond, also expressed as —Si—N— bond hereafter) is formed on the surface, for example, when a substrate having a polysilazane film formed on the surface by coating polysilazane ($SiH_2NH$, hereinafter also referred to as PHPS) on the surface, is processed by a process liquid or a process gas. Also is found a subject that quality cannot be maintained due to the generation of the foreign matters, thus inhibiting the miniaturization in some cases. Further is found a subject that the abovementioned matter involves a problem that substrate processing cannot be continued while maintaining (securing) the quality, and a manufacturing throughput is deteriorated.

The inventors of the present invention consider the cause for these subjects as follows.

First, the polysilazane film is formed by coating of a polysilazane solution and pre-bake. However, in the pre-bake, it is difficult to completely remove a solvent and impurities in the film coated with polysilazane. Therefore, in a subsequent reform processing step, the solvent remaining in the polysilazane film after pre-bake, is vaporized from the film and released into a processing vessel as an outgas, and re-adhered to the substrate, resulting in causing a reaction in some cases.

Also, in the pre-bake or the reform processing step, the polysilazane with a low molecular weight is vaporized from the coating film and released into the processing vessel as the outgas, and re-adhered to the substrate, resulting in causing a reaction with the residual solvent, and adhering to the substrate surface as foreign matters or impurities of SiO.

Further, in the reform processing step, a reaction is caused between impurities contained in a hydrogen peroxide ($H_2O_2$) water, and the solvent remaining in the polysilazane film, resulting in producing a byproduct in some cases.

As a result of strenuous efforts by the inventors of the present invention in view of the abovementioned causes, it is found that the above-described subjects can be solved by drying the substrate at a temperature required for pre-bake after coating of polysilazane or lower than this temperature in a dry processing step after reforming the polysilazane film, or by increasing a purity of a process liquid, or by a combination of these techniques.

First Embodiment of the Present Invention

A first embodiment of the present invention will be described hereafter, as one of the preferable embodiments of the present invention, with reference to the drawings.

(1) Structure of a Substrate Processing Apparatus

Figure 1:
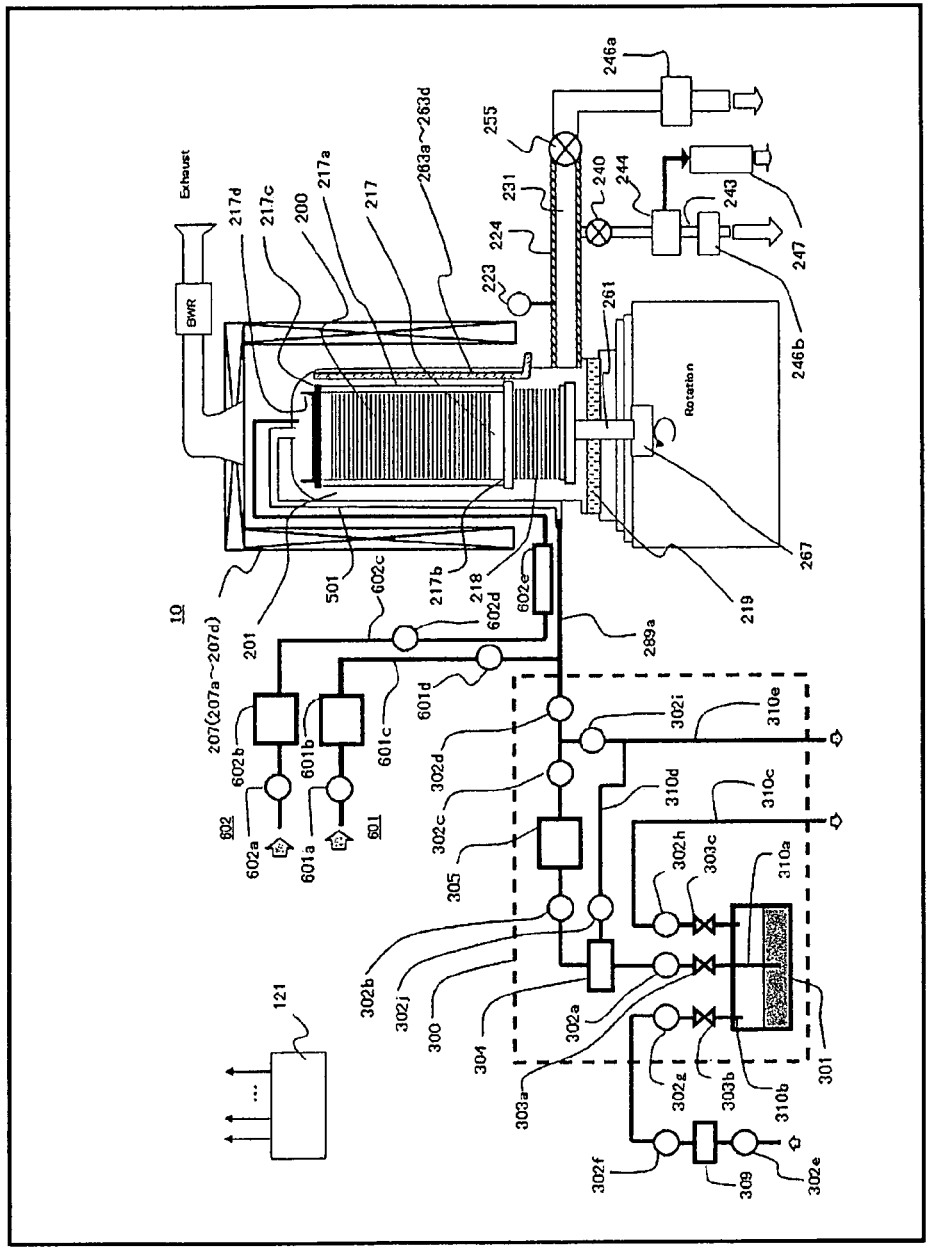
FIG. 1 is a schematic block diagram of a substrate processing apparatus according to an embodiment of the present invention.
Figure 2:
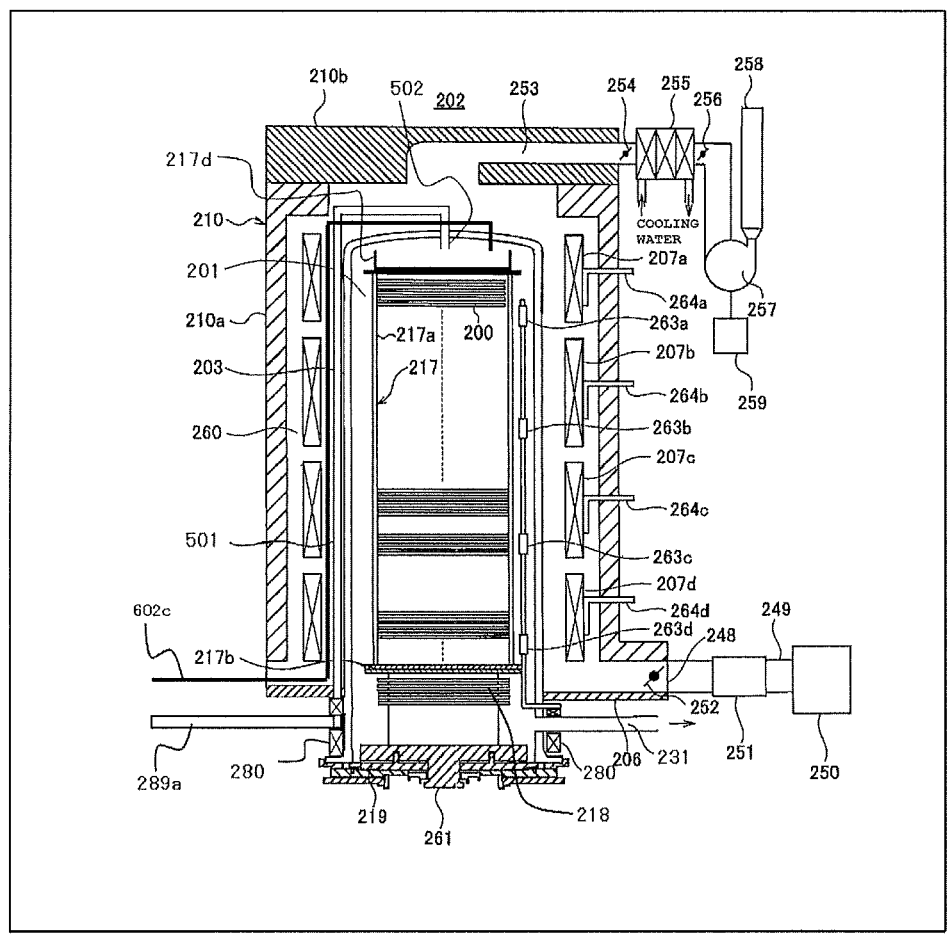
FIG. 2 is a vertical cross-sectional schematic view of a processing furnace included in the substrate processing apparatus according to an embodiment of the present invention.

The structure of a substrate processing apparatus according to this embodiment will be described first, using mainly FIG. 1 and FIG. 2. FIG. 1 is a schematic block diagram of the substrate processing apparatus according to this embodiment, showing a processing furnace portion 202 by a vertical cross-section. FIG. 2 is a vertical cross-sectional schematic view of the processing furnace 202 included in the substrate processing apparatus according to this embodiment.

(Processing Vessel)

As shown in FIG. 1, the processing furnace 202 includes a processing vessel (reaction tube) 203. The processing vessel 203 is made of a heat-resistant material such as quartz ($SiO_2$) or silicon carbide (SiC), etc., and formed into a cylindrical shape with an upper end and a lower end opened. A processing chamber 201 is formed in a cylindrical hollow part of the processing vessel (reaction tube) 203. The processing chamber 201 is configured to accommodate wafers 200 as substrates which are charged by a boat 217 described later, in a horizontal posture and in a state of being vertically arranged in multiple stages.

A seal cap 219 is provided in a lower part of the processing vessel 203 as a furnace throat lid member capable of air-tightly sealing (closing) a lower end opening (furnace throat) of the processing vessel 203. The seal cap 219 is configured to abut on the lower end of the processing vessel 203 from a vertical lower side. The seal cap 219 is formed into a disc shape. The processing chamber 201 which is a processing space for processing the substrate, is mainly constituted of the processing vessel 203 and the seal cap 219.

(Substrate Supporting Unit)

A boat 217 which is a substrate supporting unit (substrate holder) is configured to hold a plurality of wafers 200 in multiple stages. The boat 217 includes a plurality of struts 217*a* for holding a plurality of wafers 200. Three struts 217*a* are provided for example. The plurality of struts 217*a* are respectively bridged between a bottom plate 217*b* and a top plate 217*c*. The plurality of wafers 200 are arranged, with centers aligned with each other in a horizontal posture, and configured to be held in multiple stages in a tube axis direction. An outer diameter of the top plate 217*c* is set to be larger than a maximum outer diameter of the wafer 200 held by the boat 217.

For example, non-metal materials having high thermal conductivity such as silicon oxide ($SiO_2$), silicon carbide (SiC), aluminum oxide (AlO), aluminum nitride (AlN), silicon nitride (SiN), or zirconium oxide (ZrO), etc., is used as a constituent material of the strut 217*a*, the bottom plate 217*b*, and the top plate 217*c*. Particularly, the non-metal materials having thermal conductivity of 10 W/mK or more are preferably used as the abovementioned constituent materials. If the thermal conductivity is out of the question, quartz (SiO), etc., may be used as the abovementioned constituent material. Also, if contamination added to the wafer 200 by metal is out of the question, the strut 217*a* and the top plate 217*c* may be formed by a metal material such as stainless (SUS), etc., for example. When metal is used as the constituent material of the strut 217*a* and the top plate 217*c*, a coating film made of ceramic or Teflon (registered trademark), etc., may be formed on these metal members.

An insulation body 218 made of a heat-resistant material such as quartz or silicon carbide, etc., is provided in a lower part of the boat 217, so that heat from a first heating unit 207 is hardly transmitted toward the seal cap 219. The insulation body 218 functions as a heat insulation member and also functions as a holding body for holding the boat 217. Not only the insulation body 218 in which a plurality of disc-shaped insulating boards are provided in multiple stages in a horizontal posture as shown in the figure, but also a cylindrical-shaped quartz cap, etc., for example may be acceptable. Further, the insulation body 218 may be considered as one of the constituent members of the boat 217.

(Elevating Unit)

A boat elevator is provided in a lower part of the processing vessel 203, as an elevating unit for elevating the boat 217 and transferring it inside/outside the processing vessel 203. A seal cap 219 is provided to the boat elevator, to thereby seal the furnace throat when the boat 217 is elevated by the boat elevator.

A boat rotation mechanism 267 for rotating the boat 217 is provided on an opposite side to the processing chamber 201 across the seal cape 219. A rotation axis 261 of a boat rotation mechanism 267 is connected to the boat 217 passing through the seal cap 219. The boat rotation mechanism 267 is configured to rotate the wafer 200 by rotating the boat 217.

(First Heating Unit)

A first heating unit 207 for heating the wafer 200 in the processing vessel 203, is provided outside the processing vessel 203, in a concentric manner surrounding a side wall surface of the processing vessel 203. The first heating unit 207 is provided so as to be supported by a heater base 206. As shown in FIG. 2, the first heating unit 207 includes first to fourth heater units 207a to 207d. The heater units 207a to 207d are respectively provided along an arrangement direction of the wafers 200 in the processing vessel 203.

In the processing vessel 203, for example first to fourth temperature sensors 263a to 263d such as thermocouples are provided in each one of the heater units 207a to 207d which are heating units, as temperature detectors for detecting the temperature of the wafer 200 or a surrounding temperature. The temperature sensors 263a to 263d are respectively provided between the processing vessel 203 and the boat 217. The temperature sensors 263a to 263d may also be provided respectively to detect the temperature of the wafer 200 positioned in the center of the plurality of wafers 200 heated respectively by the heater units 207a to 207d.

A controller 121 described later is electrically connected to the first heating unit 207 and the temperature sensors 263a to 263d, via a temperature controller 400 shown in FIG. 3. The controller 121 is configured to control power supply to the heater units 207a to 207d at a specific timing, based on temperature information detected by the temperature sensors 263a to 263d respectively, so that the temperature of the wafer 200 in the processing vessel 203 is a specific temperature. Further, the controller 121 is configured to perform temperature setting or temperature adjustment individually for each one of the heater units 207a to 207d.

(Process Gas Supplying Unit)

As shown in FIG. 1 and FIG. 2, a process liquid supply nozzle 501 is provided between the processing vessel 203 and the first heating unit 207. The process liquid supply nozzle 501 is made of quartz, etc., having a low thermal conductivity for example. The process liquid supply nozzle 501 may have a double tube structure. The process liquid supply nozzle 501 is arranged along a side part of an outer wall of the processing vessel 203. A tip end (downstream end) of the process liquid supply nozzle 501 is air-tightly connected to a top portion (upper end opening) of the processing vessel 203. A supply hole 502 is formed on the tip end of the process liquid supply nozzle 501 connected to the upper end opening of the processing vessel 203. The supply hole 502 is configured to supply the process liquid flowing through the process liquid supply nozzle 501, toward a vaporizer 217d provided in an upper part of the boat 217 which is accommodated in the processing vessel 203. In an example described later, the supply hole 502 is configured to drop the process liquid toward the vaporizer 217d. However, the structure of the supply hole 502 is not limited to such a mode, and for example the process liquid may be injected toward the vaporizer 201d from the supply hole 502. A process gas supplying unit is mainly constituted of the vaporizer 217d as a vaporization unit, the process liquid supply nozzle 501, and the supply hole 502 as a process liquid supplying unit.

Further, an oxygen-containing process gas supplying unit 602 may be included in the abovementioned process gas supplying unit. The oxygen-containing process gas supplying unit 602 includes a gas supply pipe 602c for supplying an oxygen-containing gas. A valve 602a, a gas flow control unit (gas flow controller) 602b, and a valve 601d are provided on the gas supply pipe 602c sequentially from an upstream side. A gas containing at least one of oxygen ($O_2$) gas, ozone gas ($O_3$) gas, and nitrous oxide (NO) gas, is used as the oxygen-containing gas. Also, a gas heating unit 602e for heating the oxygen-containing gas is provided on the gas supply pipe 602c. The gas heating unit 602e is configured to heat the oxygen-containing gas flowing through the gas supply pipe 602c at a temperature of about 80 to 150° C., preferably about 100° C. to 120° C. for example. Vaporization of the process liquid supplied to the vaporizer 217d is assisted by heating the oxygen-containing gas. In addition, liquefaction of the process gas supplied into the processing vessel 203 can be suppressed. Heating of the oxygen-containing gas may be performed by the abovementioned first heating unit.

A downstream end of the process liquid supply pipe 289a for supplying process liquid, is connected to an upstream end of the process liquid supply nozzle 501. A liquid flow control unit 300 and a purge process gas supplying unit 601 are provided on the process liquid supply pipe 289a sequentially from an upstream direction.

(Liquid Flow Control Unit)

The liquid flow control unit 300 includes a fluid pipe 310a for supplying the process liquid. The downstream end of the fluid pipe 310a is connected to the upstream end of the process liquid supply pipe 289a. A reserve tank 301, an automatic valve 302a, a hand valve 303a, a filter 304, an automatic valve 302b, a liquid flow controller (LMFC) 305, and valves 302c and 302d are provided on the fluid pipe 310a sequentially from the upstream side. The upstream end of the fluid pipe 310a is provided so as to be positioned at a liquid face or lower than the liquid face of the process liquid stored in the reserve tank 301. A pressurized gas supplying unit, a gas exhausting unit, and a process liquid discharging unit are connected to the reserve tank 301. The volume of the reserve tank 301 is preferably set to 1 to 5 litters, and can be set to 2 litters for example. The volume of the reserve tank 301 is preferably the volume in which a substrate processing step described later can be performed more than once in a row.

The pressurized gas supplying unit includes the gas pipe 310b for supplying a pressurized gas. An automatic valve 302e, a gas flow controller (MFC) 309, automatic valves 302f and 302g, and a hand valve 303b are provided on the gas pipe 310b sequentially from the upstream side. The downstream end of the gas pipe 310b is provided so as to be positioned above the liquid face of the process liquid stored in the reserve tank 301. The pressurized gas supplying unit is constituted of at least the gas pipe 310b, the automatic valve 302g, and the MFC 309. The automatic valves 302e, 302f and the hand valve 303b may be included in the pressurized gas supplying unit. The process liquid is fed to the filter 304 under pressure, from the reserve tank 301.

A gas discharging unit includes a gas pipe 310c. A hand valve 303c and an automatic valve 302h are provided on the gas pipe 310c sequentially from the upstream side. The upstream end of the gas pipe 310c is provided so as to be positioned above the liquid face of the process liquid stored in the reserve tank 301. The gas discharging unit is constituted of at least the gas pipe 310 and the automatic valve 302h. The hand valve 303c may be included in the gas discharging unit.

A drain tube 310e is connected between the automatic valves 302c and 302d in the fluid pipe 310a. An automatic valve 302i is provided on the drain pipe 310e. Further, a gas pipe 310d is connected to the filter 304. The downstream end of the gas pipe 310d is connected to the downstream side of the automatic valve 302i in the drain pipe 310e. An automatic valve 302j is provided on the gas pipe 310d. The filter 304 is configured to retrieve a gas contained in the process liquid supplied from the reserve tank 301, and feed only liquid to LMFC 305 through the fluid pipe 310a. The gas contained in the process liquid is discharged through the gas pipe 310d and the drain pipe 310e. The process liquid fed from the filter 304 is subjected to flow control by the LMFC 305, and is supplied into the process liquid supply pipe 289a.

The purge process gas supplying unit 601 includes the purge gas supply pipe 601c for supplying a purge gas. An automatic valve 601a, MFC 601b, and an automatic valve 601d are provided on the purge gas supply pipe 601c sequentially from the upstream side. The downstream end of the purge gas supply pipe 601c is connected to the process liquid supply pipe 289a. An inert gas with low reactivity to the wafer 200 or a film formed on the wafer 200, is preferably used as the purge gas, and a rare gas such as nitrogen gas ($N_2$) gas, Ar (argon) gas, He (helium) gas, or Ne (neon) gas, etc., is used for example.

(Exhausting Unit)

The upstream end of the first exhaust pipe 231 for exhausting the gas in the processing chamber 201, is connected in the lower part of the processing vessel 203. An APC (Auto Pressure Controller) valve 255 which is a pressure adjuster, and a vacuum pump (exhaust device) 246a are provided on the first exhaust pipe 231 sequentially from the upstream side. A second exhaust pipe 243 is connected to the upstream side of the APC valve 255 in the first exhaust pipe 231. An APC valve 240, a separator 244, and a vacuum pump (exhaust device) 246b are provided on the second exhaust pipe 243 sequentially from the upstream side. A liquid recovery tank 247 is connected to the separator 244.

Inside of the processing chamber 201 is exhausted by a negative pressure generated in the vacuum pumps 246a and 246b. The APC valves 255 and 240 are open/close valves capable of performing exhaust and stop of exhaust inside of the processing chamber 201 by opening and closing the valve, which are also pressure adjustment valves capable of adjusting the pressure in the processing chamber 201 by adjusting an opening degree of the valve. A pressure sensor 223 which is a pressure detector, is provided on the upstream side of the APC valve 255 in the first exhaust pipe 231. A controller 121 described later (see FIG. 3) is electrically connected to the pressure sensor 223. The controller 121 is configured to control the valve opening degree of the APC valves 255 and 240 based on pressure information detected by the pressure sensor 223, and control at a desired timing so that the pressure in the processing chamber 201 is a desired pressure.

A first exhausting unit is mainly constituted of the first exhaust pipe 231, the APC valve 255, and the pressure sensor 223. The vacuum pump 246a may be included in the first exhausting unit. Also, a second exhausting unit is constituted of the second exhaust pipe 243 and the APC valve 240. The upstream side of a connection point connecting to the second exhaust pipe 243 in the first exhaust pipe 231, namely, the pressure sensor 223, the separator 244, and the vacuum pump 246b may be included in the second exhausting unit. In this specification, either one of the first exhausting unit and the second exhausting unit, or both of them are simply called an exhausting unit.

(Second Heating Unit)

For example when a hydrogen peroxide is used as a reactant, and a hydrogen peroxide gas is used as the process gas in the substrate processing step described later, there is a possibility that the hydrogen peroxide gas is cooled to a lower temperature than a vaporization point of the hydrogen peroxide in the processing vessel 203, thus possibly causing a re-liquefaction. The hydrogen peroxide gas is in a vaporized or a mist state of a hydrogen peroxide solution which is the hydrogen peroxide in a liquid state.

The re-liquefaction of the hydrogen peroxide gas frequently occurs in an area other than the area heated by the first heating unit 207 in the processing vessel 203. As described above, the first heating unit 207 is provided to heat the wafer 200 in the processing vessel 203. Therefore, the area for accommodating the wafer 200 in the processing vessel 203, is appropriately heated by the first heating unit 207. However, the area other than the area for accommodating the wafer 200 in the processing vessel 203, is hardly heated by the first heating unit 207. As a result, the area other than the area heated by the first heating unit 207, is likely to be a relatively low temperature area, and there is a case that the hydrogen peroxide gas is cooled when passing through such a low temperature area, resulting in causing re-liquefaction.

The liquid caused by the re-liquefaction of the hydrogen peroxide gas (simply called a "liquid" hereafter), is sometimes accumulated on an upper surface, etc., of the seal cap 219. Therefore, the re-liquefied hydrogen peroxide and the seal cap 219 are reacted with each other, and the seal cap 219 is sometimes damaged.

In addition, when the liquid is accumulated on the seal cap 219, the liquid on the seal cap 219 sometimes drops to outside of the processing vessel 203 from the furnace throat, when the seal cap 219 is descended to open the furnace throat (lower end opening of the processing vessel 203). Therefore, a member around the furnace throat of the processing furnace 202 is sometimes damaged, and a worker, etc., cannot safely enter in the vicinity of the processing furnace 202 in some cases.

The hydrogen peroxide solution is produced by dissolving the hydrogen peroxide in water, using hydrogen peroxide ($H_2O_2$) as a source (reactant) which is a solid state or a liquid state at a normal temperature, and using water ($H_2O$) as a solvent. It is known that a boiling point (vaporization point) of the hydrogen peroxide is higher than the boiling point of water. Therefore, the liquid generated after re-liquefaction of the hydrogen peroxide gas has sometimes a high concentration of the content of the hydrogen peroxide, compared with the hydrogen peroxide solution when being supplied into the processing vessel 203.

Then, the liquid generated by the re-liquefaction of the hydrogen peroxide gas, is vaporized again in the processing vessel 203, and a vaporized gas is generated again in some cases (such a gas is called a "re-vaporized gas" hereafter).

As described above, the vaporization point is different between the hydrogen peroxide and water, and therefore water is previously evaporated and exhausted. Accordingly, the re-vaporized gas has a high concentration of the hydrogen peroxide, compared with the hydrogen peroxide gas immediately after being supplied to the wafer 200.

Accordingly, the concentration of the hydrogen peroxide gas is sometimes uneven in the processing vessel 203 in which the re-vaporized gas is generated. For example, the concentration of the hydrogen peroxide gas is likely to be high at a bottom part of the processing vessel 203 in which the hydrogen peroxide solution of high concentration is easily accumulated, compared with the other place. As a result, uneven substrate processing is applied to a plurality of wafers 200 in the processing vessel 203, thus sometimes generating a variation in the characteristic of the substrate processing, and generating the uneven substrate processing applied to the lots.

Also, the concentration of the hydrogen peroxide is sometimes increased by repeating the re-liquefaction and re-vaporization of the hydrogen peroxide. As a result, explosion or combustion due to the high concentration of the hydrogen peroxide is likely to occur.

In order to solve the above-described problems, according to this embodiment, as shown in FIG. 1 and FIG. 2, a second heating unit 280 is provided to heat the area other than the area heated by the first heating unit 207. The second heating unit 280 is preferably provided to outside (outer periphery) of the lower part of the processing vessel 203 so as to concentrically surround the side wall surface of the processing vessel 203.

The second heating unit 280 is configured to heat the hydrogen peroxide gas flowing from an upper side (upstream side) to a lower side (downstream side) of the processing vessel 203 toward the first exhaust pipe 231, at the downstream side in the processing vessel 203) (that is, area for accommodating the insulation body 218 in the processing vessel 203). Also, the second heating unit 280 is configured to heat the members around the furnace throat of the processing vessel 203, that is, the members constituting the lower part of the processing vessel 203, such as a seal cap 219 for sealing the lower end opening of the processing vessel 203, the lower part of the processing vessel 203, and the insulation body 218, etc., disposed at the bottom part of the processing vessel 203. In other words, the second heating unit 280 is configured to heat the members constituting the area lower than a position of the bottom plate 217b when the boat 217 is loaded into the processing chamber 201.

A controller 121 described later is electrically connected to the second heating unit 280. The controller 121 is configured to control power supply to the second heating unit 280 at a specific timing, so that the temperature in the processing chamber 203 is set to the temperature (for example 100° C. to 300° C.) and the liquefaction of the process gas (hydrogen peroxide gas) can be suppressed at the downstream side in the processing vessel 203. Heating of the furnace throat part of the processing vessel 203 by the second heating unit 280 is continuously performed at least while the process liquid is supplied into the processing vessel 203. Preferably, the heating is continuously performed from loading to unloading of the wafer 200 into/ from the processing vessel 203. By performing the heating using the second heating unit 280, the liquefaction of the process gas in the furnace throat part and the adhesion of particles and impurities to the furnace throat, can be prevented. Further, by starting the heating using the second heating unit 280 immediately after loading of the wafer 200, the time required for arranging an environment before supplying the process gas, can be shortened.

(Control Unit)

Figure 3:
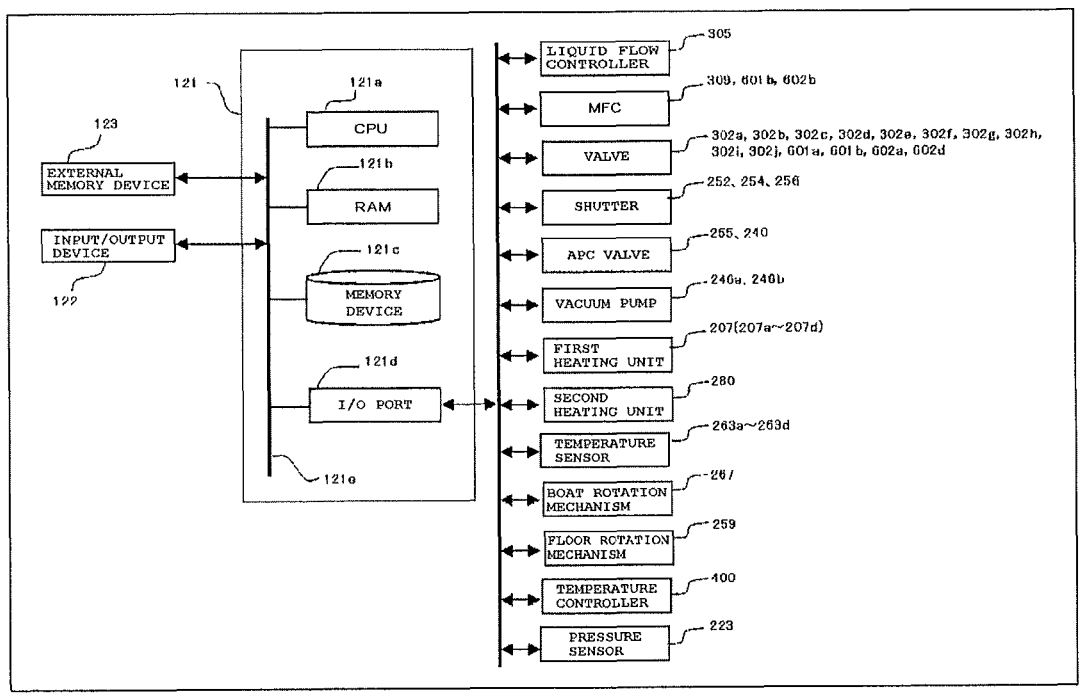
FIG. 3 is a schematic block diagram of a controller of the substrate processing apparatus suitably used in the embodiment of the present invention.

As shown in FIG. 3, the controller 121 which is the control unit (control means) is constituted as a computer including CPU (Central Processing Unit) 121a, RAM (Random Access Memory) 121b, and I/O port 121d. The RAM 121b, a memory device 121c, and the I/O port 121d are configured so that data exchange with CPU 121a can be carried out via an internal bus 121e. An input/output device 122 constituted as a touch panel, etc., for example, is connected to the controller 121.

The memory device 121c is constituted of a flash memory and HDD (Hard Disk Drive), etc., for example. A control program for controlling an operation of the substrate processing apparatus, and a process recipe, etc., in which a procedure or a condition of substrate processing described later, are readably stored in the memory device 121c. The process recipe is a combination of recipes so that each procedure in the substrate processing step described later is executed by the controller 121, and a prescribed result can be obtained, thereby functioning as a program. The program recipe and the control program, etc., are generally and simply called the program hereafter. The term of the program is used in the following cases in this specification, meaning the process recipe alone, meaning the control program alone, or meaning the both cases thereof. Further, the RAM 121b is constituted as a memory area (work area) in which the program or data, etc., read by the CPU 121a is temporarily stored.

The I/O port 121d is connected to the abovementioned LMFC 305, MFC 309, 601b, 602b, automatic valves 302a to 302j, 601a, 601d, 602a, 602d, shutters 252, 254, 256, APC valves 255, 240, vacuum pumps 246a, 246b, pressure sensor 223, first heating unit 207 (207a, 207b, 207c, and 207d), second heating unit 280, temperature sensors 263a to 263d, boat rotation mechanism 267, and blower rotation mechanism 259, etc.

The CPU 121a is configured to read and execute a control program from the memory device 121c, and read the process recipe from the memory device 121c according to input, etc., of an operation command from the input/output device 122. Also, the CPU 121a is configured to control a process liquid flow adjustment operation by LMFC 305, a gas flow adjustment operation by MFC 309, 601b, and 602b, an open/close operation of the automatic valves 302a to 302j, and 601a, 601d, 602a, and 602d, a shielding operation of the shutters 252, 254, and 256, an open/close adjustment operation of the APC valves 255 and 240, a temperature adjustment operation of the first heating unit 207 based on the temperature sensors 263a to 263d, a temperature adjustment operation of the second heating unit 280, start and stop of the vacuum pumps 246a and 246b, a rotation speed adjustment operation of the blower rotation mechanism 259, and a rotation speed adjustment operation of the boat rotation mechanism 267, etc.

The controller 121 may be configured not only as a dedicated computer, but also as a general-purpose computer. For example, an external memory device 123 storing the abovementioned program (for example, a magnetic disc such as a magnetic tape or a flexible disc, an optical disc such as CD or DVD, etc., a magneto-optical disc such as MO, and a semiconductor memory such as a USB memory or a memory card, etc.,) is prepared, and the program is installed on the general-purpose computer using this external memory device 123, to thereby constitute the controller 121 of this embodiment. The means for supplying the program to the computer is not limited to the case that it is supplied via the external memory device 123. For example, the program may be supplied without passing through the external memory device 123, using a communication means such as an Internet or a dedicated line, etc. The memory device 121c and the external memory device 123 are configured as a non-transitory computer readable recording medium. They are genetically simply called a recording medium hereafter. The term of the recording medium is used in the following cases in this specification, meaning the memory device 121c alone, meaning the external memory device 123 alone, or meaning the both cases thereof.

(2) Pre-Processing Step

Here, a pre-processing step performed before applying the substrate processing step described later to the wafer 200 which is the substrate, will be described using FIG. 4.

Figure 4:
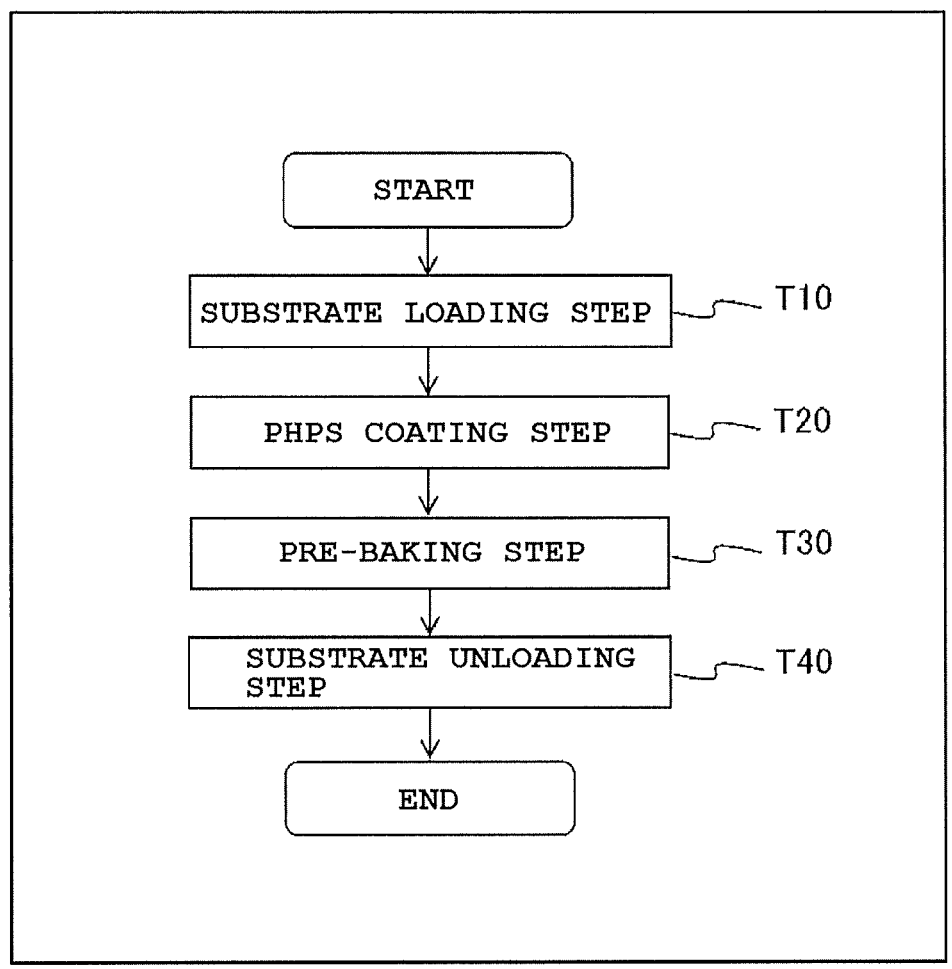
FIG. 4 is a flowchart showing a pre-processing of a substrate processing step according to an embodiment of the present invention.

As shown in FIG. 4, a polysilazane (PHPS) coating step (T20) and a pre-baking step (T30) are sequentially applied to the wafer 200. In the PHPS coating step (T20), the surface of the wafer 200 is coated with polysilazane using a coater (not shown). A thickness of the polysilazane for coating is adjusted by a molecular amount of the polysilazane, viscosity of the polysilazane solution, and the number of rotations of the coater. In the pre-baking step (T30), the solvent is removed from the polysilazane used for coating the surface of the wafer 200. Specifically, by heating the wafer 200 coated with the polysilazane at the temperature of about 70° C. to 250° C., the solvent is volatilized from a coating film of polysilazane. Such a heating processing is preferably performed at about 150° C.

A silicon substrate, etc., having an uneven structure which is a fine structure formed on the surface, can be suitably used as the wafer 200. At least a recess portion (groove) is filled with polysilazane supplied to the surface of the wafer 200, thus forming a silicon (Si)-containing film having a silazane-bond in the groove. In the wafer 200, the Si-containing film having the silazane-bond is formed, and pre-bake is applied to this film. In the substrate processing step described later, explanation is given for an example of applying reform processing to this wafer 200 by supplying a vaporized gas of the hydrogen peroxide solution as the process gas. Si or nitrogen (N), and hydrogen (H) are contained in the Si-containing film, and there is a possibility that carbon (C) and other impurities are mixed therein in some cases. The substrate having a fine structure is the substrate having deep grooves (recess portions) vertically to the surface of the substrate, or the substrate having narrow grooves (recess portions) having a width of about 10 nm to 30 nm in parallel to the surface of the substrate. That is, the substrate having the fine structure is the substrate in which an uneven structure is formed on its surface with high aspect ratio.

(3) Substrate Processing Step

Figure 5:
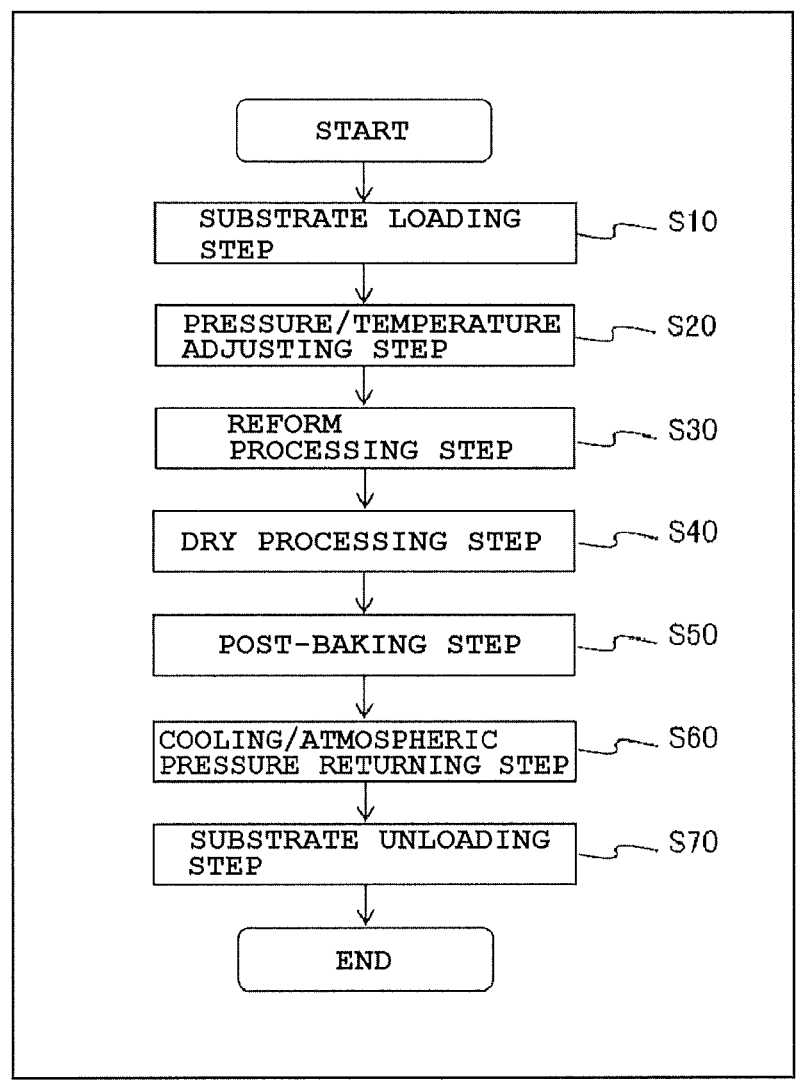
FIG. 5 is a flowchart showing a substrate processing step according to an embodiment of the present invention.
Figure 6:
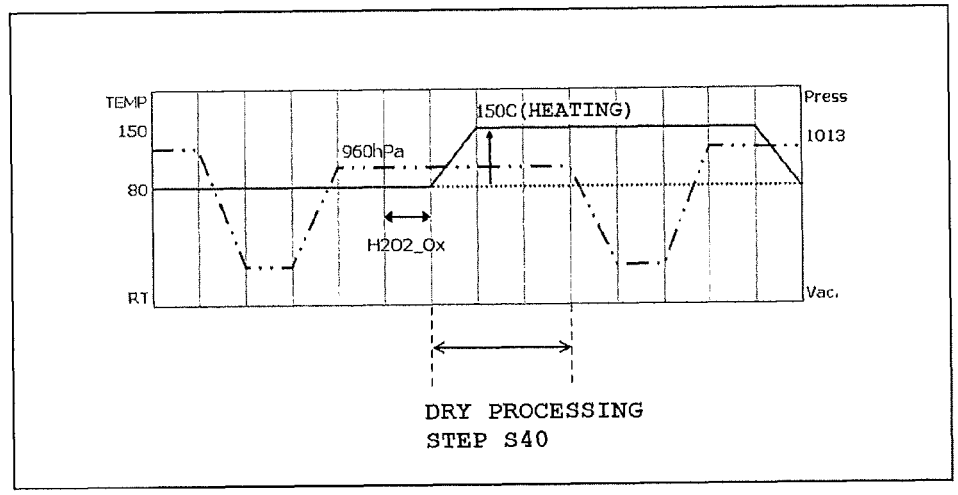
FIG. 6 is a view showing a substrate processing event and a temperature timing example according to an embodiment of the present invention.

Subsequently, the substrate processing step performed as one step of the manufacturing step of a semiconductor device of this embodiment, will be described using FIG. 5 and FIG. 6. This step is performed by the abovementioned substrate processing apparatus. In this embodiment, as an example of the substrate processing step, explanation is given for the step of reforming (oxidizing) the silicon-containing film formed on the wafer 200 which is the substrate, to a silicon oxide film (SiO film) (reform processing step). In the explanation given hereafter, an operation of each part constituting the substrate processing apparatus is controlled by the controller 121.

When compared with water vapor (water $H_2O$), the hydrogen peroxide solution has a high activation energy, and has a strong oxidizing power, because a large number of oxygen atoms are contained in one molecule. Therefore, by using the hydrogen peroxide gas as the process gas, the oxygen atoms (O) can reach a deep portion of the film (bottom of the groove) formed in the groove on the surface of the wafer 200. Accordingly, a degree of the reform processing can be equalized between the surface portion and the deep portion of the film on the wafer 200. That is, more uniform substrate processing can be performed between the surface portion and the deep portion of the film formed on the wafer 200, and a dielectric constant, etc., of the film after reform processing can be equalized in a thickness direction. In addition, by using the hydrogen peroxide gas as the process gas, the reform processing step can be performed at a low temperature, and deterioration, etc., of the performance of a circuit element formed on the wafer 200 can be suppressed. In this embodiment, the hydrogen peroxide which is a reactant in a gas state or a mist state (that is, hydrogen peroxide in a gas state) is called a hydrogen peroxide gas, and the hydrogen peroxide in a liquid state (hydrogen peroxide solution) is called a process liquid.

(Substrate Loading Step (S10))

First, Previously Specified Number of Wafers 200 is charged on the boat 217 (wafer charge). Then, the boat 217 holding a plurality of wafers 200 are elevated by a boat elevator and loaded into the processing vessel 203 (in the processing chamber 201). In this state, the furnace throat which is an opening part of the processing furnace 202, is set in a sealed state by the seal cap 219.

(Pressure/Temperature Adjusting Step (S20))

Inside of the processing vessel 203 is vacuum-exhausted by at least either one of the vacuum pumps 246a and 246b, so that the inside of the processing vessel 203 has a desired pressure (vacuum degree). Further, valves 602a and 601d are opened, so that the oxygen-containing gas is supplied into the processing vessel 203 from the oxygen-containing process gas supplying unit 602. Preferably, the oxygen-containing gas is supplied after heating it at 100° C. to 120° C. for example by the gas heating unit 602e for example. At this time, the pressure in the processing vessel 203 is measured by the pressure sensor 223, and based on this measured pressure, open/close of the APC valves 255 and 240 are feedback-controlled (Pressure adjustment). The pressure in the processing vessel 203 is adjusted in a slight decompression state, for example adjusted to 700 hPa to 1000 hPa.

The wafer 200 accommodated in the processing vessel 203, is heated to the first temperature, for example to 40° C. to 300° C., and preferably to 70° C. to 130° C. for example, by the first heating unit 207. At this time, power supply to the heater units 207a to 207d is feedback-controlled based on the temperature information detected by the temperature sensors 263a to 263d (temperature adjustment). At this time, setting temperatures of all of the heater units 207a to 207d are controlled to the same temperature. Further, inside of the processing vessel 203 is heated by the second heating unit 280 at a temperature of not allowing the hydrogen peroxide gas to be re-liquefied in the lower part of the processing vessel (reaction tube) 203. The setting temperature of the second heating unit 280 is 100° C. to 200° C. for example.

Also, rotation of the boat 217 is started by operating the boat rotation mechanism 267 while heating the wafer 200. At this time, the rotation speed of the boat 217 is controlled by the controller 121. A rotation state of the boat 217 is always maintained until at least the end of the reform modification processing step (S30) described later.

(Reform Processing Step (S30))

When the temperature of the wafer 200 reaches a specific first temperature and the rotation of the boat 217 reaches a desired rotation speed, supply of the hydrogen peroxide solution into the processing vessel 203 is started through the process liquid supply pipe 289a and the process liquid supply nozzle 501. FIG. 6 shows an example of starting the reform processing step (S30) at 80° C., that is, an example of setting the first temperature at 80° C.

The procedure of the reform processing step (S30) will be more specifically described hereafter. First, valves 303a and 302a to 302d are opened, with valves 302h, 302j, and 302i closed. Next, valves 303b, 302e to 302g are opened, so that the pressurized gas is supplied into the reserve tank 301 from a pressurized gas supply source (not shown) while controlling the flow rate by the MFC 309. Then, the hydrogen peroxide solution stored in the reserve tank 301 is supplied into the processing vessel 203 through the process liquid supply pipe 289a, the process liquid supply nozzle 501, and the supply hole 502, while controlling the flow rate by the LMFC 305. The flow rate of the hydrogen peroxide solution is set to 1 cc/min to 30 cc/min, preferably 5 cc/min to 20 cc/min, and further preferably 10 cc/min for example. As the pressurized gas, inert gas such as nitrogen ($N_2$) gas, etc., and rare gas such as He gas, Ne gas, and Ar gas, etc., can be used for example.

Not the hydrogen peroxide gas but the hydrogen peroxide solution is preferably flowed through the process liquid supply nozzle 501. This is because if the hydrogen peroxide gas is flowed through the process liquid supply nozzle 501, there is sometimes a variation generated in the concentration of the hydrogen peroxide gas supplied into the processing vessel 203 in some cases, depending on a thermal condition of the process liquid supply nozzle 501. In this case, a distribution of the concentration of the hydrogen peroxide in the processing vessel 203 becomes unstable, thus making it difficult to perform substrate processing with good reproducibility in some cases. Further, if the concentration of the hydrogen peroxide in the process liquid supply nozzle 501 becomes high, inside of the process liquid supply nozzle 501 is corroded in some cases, and there is a possibility that a foreign matter generated due to corrosion has an adverse influence on the substrate processing such as film processing, etc., for example. Therefore, in this embodiment, not the hydrogen peroxide gas but the hydrogen peroxide solution is flowed through the process liquid supply nozzle 501.

The hydrogen peroxide solution supplied into the processing vessel 203 from the process liquid supply nozzle 501, is brought into contact with the vaporizer 217d which is a heated vaporization unit, and is vaporized. Thus, the hydrogen peroxide gas (that is, hydrogen peroxide solution gas) is generated as the process gas. In order to accelerate the vaporization of the hydrogen peroxide solution, a third heating unit (not shown) may be provided in the upper part or around the vaporizer 217d to thereby heat the vaporizer 217d.

The hydrogen peroxide solution gas generated in the processing chamber 201 flows toward the first exhaust pipe 231, and is supplied on the surface of the wafer 200 in this process. As a result, an oxidizing reaction occurs on the surface of the wafer 200, and the polysilazane film formed on the wafer 200 is modified to the SiO film.

When the hydrogen peroxide solution is supplied into the processing vessel 203, the hydrogen peroxide contained in the exhaust gas may be recovered by exhausting the inside of the processing chamber 201 using the abovementioned second exhaust system. In this case, the atmosphere in the processing vessel 203 may be exhausted through the second exhaust pipe 243 by closing the APC valve 255 and opening the APC valve 240. The exhaust gas flowing through the second exhaust pipe 243 is separated by the separator 244, into a liquid containing the hydrogen peroxide and a gas not containing the hydrogen peroxide. The liquid containing the hydrogen peroxide is recovered in the liquid recovery tank 247, and the gas not containing the hydrogen peroxide is exhausted from the vacuum pump 246b.

Further, when the hydrogen peroxide solution is supplied into the processing vessel 203, the inside of the processing vessel 203 may be pressurized by containing the hydrogen peroxide gas in the processing vessel 203 by closing the APC valves 255 and 240 or narrowing the opening degree. Thus, the distribution of the concentration of the hydrogen peroxide gas in the processing vessel 203 can be made uniform, and in-plane uniformity of the reform modification processing in the wafer 200, and uniformity of the reform processing among wafers 200 can be respectively improved. In addition, by pressurizing the inside of the processing vessel 203, the abovementioned oxidizing reaction can be accelerated and a film quality of the SiO film can be improved. Also, the time required for the oxidizing processing can be shortened and productivity can be improved.

Preferably, the supply of the oxygen-containing gas from the oxygen-containing process gas supplying unit 602 is previously started before staring the supply of the hydrogen peroxide solution into the processing vessel 203, and the inside of the processing vessel 203 is maintained in a slight decompression state. The flow rate (first flow rate) of the oxygen-containing gas can be set to 1 slm to 30 slm, and preferably 5 slm to 20 slm, and more preferably 10 to 20 slm for example. When the hydrogen peroxide gas is supplied into the processing vessel 203, the abovementioned reform speed can be improved by supplying the oxygen-containing gas, thereby improving the time required for the reform processing. Further, generation of the foreign matter in the processing vessel 203 can be suppressed. In addition, by starting the supply of the oxygen-containing gas into the processing vessel 203 before staring the supply of the hydrogen peroxide solution into the processing vessel 203, that is, before starting the generation of the hydrogen peroxide gas, in-plane uniformity of the reform processing in the wafer 200, and uniformity of the reform processing among wafers 200 can be respectively improved. Also, the quality of the reform processing can be improved. This is because when the hydrogen peroxide gas is generated in a state of not previously supplying the oxygen-containing gas, processing to the wafer 200 provided in the upper part of the processing vessel 203, and processing to the wafer 200 provided in the lower part of the processing vesse4l 203 are started at a different timing, thus possibly reducing the uniformity of the reform modification processing among wafers 200. There is also a possibility that a generation amount of the foreign matter in the processing vessel 203 is increased, and it becomes difficult to control the film quality. In contrast, these problems can be prevented by previously supplying the oxygen-containing gas into the processing vessel 203, and maintaining the inside of the processing vessel 203 in a slight decompression state.

After elapse of a specific time and at the end of the reform of the polysilazane film, the valve 302d is closed and supply of the hydrogen peroxide solution into the processing vessel 203 is stopped. Also, the valves 602a and 601d are closed, and supply of the oxygen-containing gas into the processing vessel 203 is stopped.

Here, commercially available hydrogen peroxide solution includes acid or chloride as a stabilizer in some cases. Also, commercially available hydrogen peroxide solution includes a case that an impurity is contained. For example, at least anyone of the elements such as Ag, Al, As, Au, B, Ba, Bi, Ca, Cd, Co, Cr, Cu, Fe, Ga, Ge, K, Li, Mg, Mn, Mi, Na, Ni, Pb, Sb, Si, Sn, Sr, Ta, Ti, V, Zn, and Zr, etc., can be given as the impurity. The impurity can mix in the hydrogen peroxide solution when a vessel containing the hydrogen peroxide solution is transported, stored, or attached to a substrate processing apparatus. It can be considered that the amount of the mixed impurity is varied depending on whether or not the vessel has a mechanism of preventing the mixture of the impurity from outside, and for example the amount of about 0.1 ppm to 10 ppm can be considered. It is found by the inventors of the present invention, that a reaction is caused between the stabilizer or the impurity, and the solvent or the impurity remained in the polysilazane film or polysilazane, thus possibly generating the foreign matter (particle). Therefore, the inventors of the present invention examine the content of the stabilizer or the impurity in the hydrogen peroxide solution with high purity, and in a standard hydrogen peroxide solution. As a result, it is found that the amount of the stabilizer or the impurity contained in the hydrogen peroxide solution with high purity is about ½ or less of the amount of the stabilizer or the impurity contained in the standard hydrogen peroxide solution. For example, 10 ppm or less of acid or 0.3 ppm or less of chloride is contained in the standard hydrogen peroxide solution, and 5 ppm or less of acid or 0.02 ppm or less of chloride is contained in the hydrogen peroxide solution with high purity. A comparison result of comparing between the number of particles when using the standard product and the number of particles when using the high purity product, will be described later.

(Dry Processing Step (S40))

After the end of the reform processing step (S30), the temperature of the wafer 200 is decreased to a specific second temperature which is not more than the processing temperature in the abovementioned pre-baking step (T30). The second temperature is the temperature higher than the first temperature, and is set to the temperature of not more than the processing temperature in the pre-baking step (T30). The second temperature can be set to 150° C. for example. After heating, the temperature is maintained, to thereby slowly dry the wafer 200 and the inside of the processing vessel 203. By drying them in this manner, not only ammonia, ammonium chloride, carbon, and hydrogen which are byproducts separated from a polysilazane film, but also the impurity such as an outgas caused by the solvent, and the impurity caused by the hydrogen peroxide, or the like, can be removed from the wafer 200, that is, from inside of the SiO film or from the surface of the SiO film. Further, these substances can be prevented from re-adhering to the wafer 200.

The flow rate of the oxygen-containing gas is preferably set to a second flow rate which is larger than the first flow rate, before the wafer 200 is heated to the second temperature or simultaneously with heating the wafer 200. The second flow rate can be set to 10 slm to 40 slm for example. By increasing the flow rate of the oxygen-containing gas before heating the wafer 200 to the second temperature, an efficiency of removing the impurity can be improved.

(Post-Baking Step (S50))

After the end of the dry processing step (S40), the wafer 200 is heated to a higher temperature than the second temperature in the dry processing step (S40), and heat treatment is applied thereto in an atmosphere containing at least one of nitrogen, oxygen, or argon. By this post-bake processing, hydrogen remained in the SiO film can be removed, and the SiO film can be modified to an excellent film with less content of hydrogen. That is, by performing the post-bake processing, the quality of the SiO film can be improved. However, in the step other than a device step (for example, STI, etc.) in which high quality oxide film is required, priority is put on manufacturing throughput in some cases. In this case, the post-bake processing is not required.

(Cooling/Atmospheric Pressure Returning Step (S60))

After the end of the dry processing step (S40) or the post-baking step (S50), at least either one of the APC valves 255 and 240 is opened, to thereby vacuum-exhaust the inside of the processing vessel (reaction tube) 203. Thus, particles or impurities remained in the processing vessel 203 can be removed. After vacuum-exhaustion, either one of the APC valves 255 and 240 is closed, to thereby supply the inert gas such as $N_2$ gas, etc., into the processing vessel 203 from the purge process gas supplying unit 601, and allow the pressure inside of the processing vessel 203 to return to the atmospheric pressure. By return to the atmospheric pressure, heat capacity in the processing vessel 203 can be increased, and the wafer 200 and the processing vessel 203 can be uniformly heated. By uniformly heating the wafer 200 and the processing vessel 203, the particles or the impurities not removed by the vacuum-exhaustion, and the outgas from the wafer 200 and the residual impurities contained in the hydrogen peroxide solution, can be removed from the inside of the processing vessel. After the pressure in the processing vessel 203 is returned to the atmospheric pressure and after elapse of a specific time, the wafer 200 is cooled to a specific temperature (for example, to a temperature at the time of inserting the wafer 200).

Further, the second heating unit 280 is cooled by stopping the power supply to the second heating unit 280, while cooling the wafer 200. By starting the cooling of the second heating unit 280 after starting the cooling of the wafer 200, in-plane non-uniformity of the film quality in the wafer 200, and non-uniformity of the film quality among wafers 200, can be prevented. Further, particles and impurities generated in the processing vessel 203, the outgas from the wafer 200, and residual impurities, etc., contained in the hydrogen peroxide solution, are prevented from adsorbing on the furnace throat.

Shutters 252, 254, and 256 may be opened in a state of operating a blower 257 while cooling the wafer 200. Then, a cooling gas may be supplied into a space 260 between the processing vessel 203 and a heat insulation member 210 while performing flow control by a mass flow controller 251, and may be exhausted from a cooling gas exhaust pipe 253. For example, rare gases such as He gas, Ne gas, and Ar gas, etc., or air, etc., alone or mixture of them, may be used as the cooling gas, other than $N_2$ gas. Thus, inside of the space 260 is rapidly cooled, so that the processing vessel 203 and the first heating unit 207 provided in the space 260, can be cooled in a short time. In addition, the wafer 200 in the processing vessel 203 can be cooled in a short time.

The abovementioned cooling processing may also be performed by supplying the cooling gas into the space 260 from the cooling gas supply pipe 249, thereby filling the inside of the space 260 with the cooling gas, with shutters 254 and 256 closed. Thereafter, the shutters 254 and 256 are opened, with the blower 257 operated, so that the cooling gas in the space 260 may be exhausted from the cooing gas exhaust pipe 253.

(Substrate Unloading Step (S70))

Thereafter, the seal cap 219 is descended by the boat elevator to open the lower end of the processing vessel 203, and the processed wafer 200 is unloaded to outside of the processing vessel 203 (processing chamber 201) from the lower end of the processing vessel 203 in a state that the wafer 200 is held by the boat 217 (boat unloading). Thereafter, the processed wafer 200 is discharged from the boat 217 (wafer discharge), to thereby end the substrate processing step of this embodiment.

(4) Effect Obtained by this Embodiment

According to this embodiment, the following one or a plurality of effects can be obtained.

(a) After the end of the reform processing step (S30), the dry processing step (S40) is performed to the wafer 200 at not less than the reform processing temperature and not more than the pre-baking temperature (T30), to thereby suppress the number of particles generated on the wafer 200.

Figure 7:
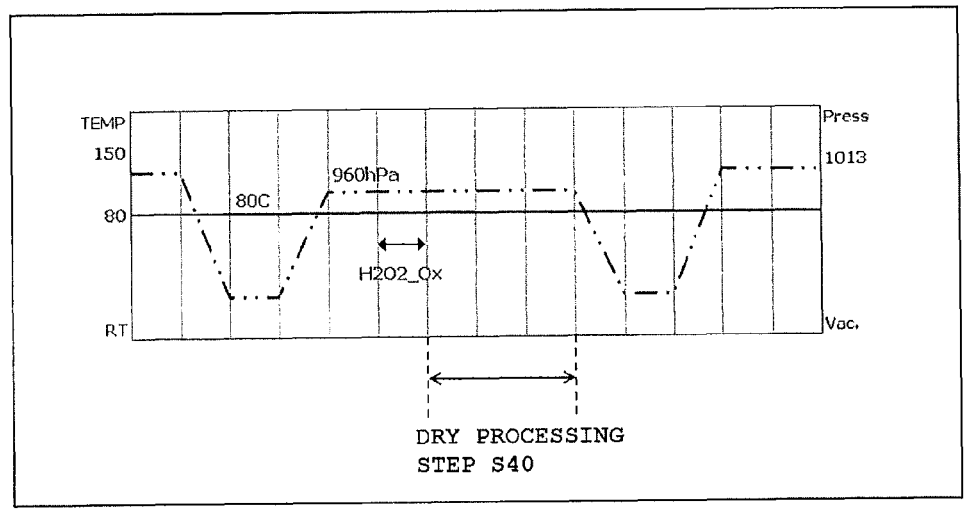
FIG. 7 is a view showing a conventional substrate processing event and temperature timing example.
Figure 8:
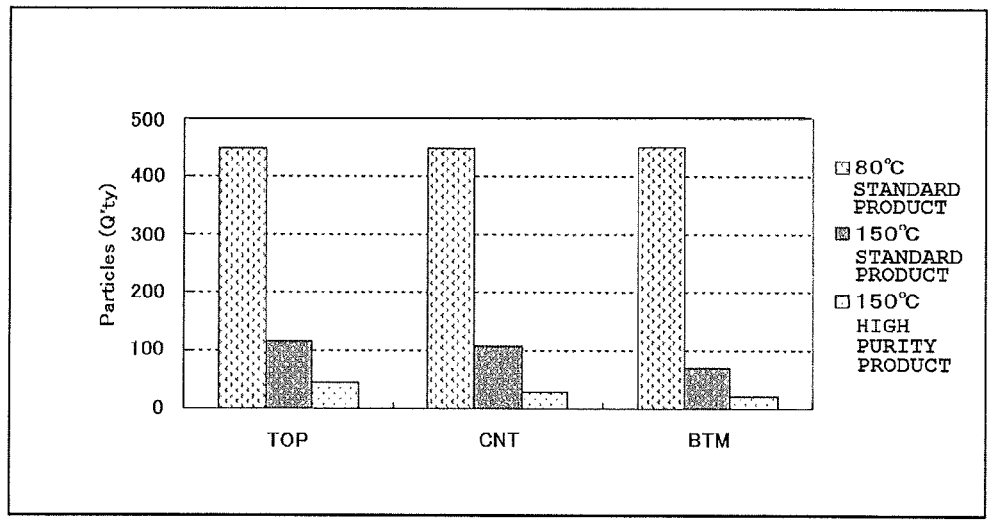
FIG. 8 is a view showing a comparison of an amount of a foreign matter on a substrate between an embodiment of the present invention and a conventional substrate.

FIG. 7 shows an example of a process sequence according to a conventional technique. Further, FIG. 8 shows a result of measuring the number of particles on the wafer 200, each of them subjected to processing under conditions shown in FIG. 6 and FIG. 7. In FIG. 6 and FIG. 7, solid line shows the temperature, and two-dot chain line shows the pressure in the processing chamber 201. FIG. 6 shows an example of performing the reform processing step (S30) at 80° C., and an example of performing the dry processing step (S40) at 150° C. FIG. 7 shows an example of performing the reform processing step (S30) and the dry processing step (S40) at 80° C. respectively.

The vertical axis in FIG. 8 shows the number of particles on the wafer 200. TOP, CNT, and BTM show a processing position for processing the waver 200, that is, an upper part, a central part, and a lower part of the boat 217 on which the wafer 200 is placed. The temperature (80° C. and 150° C.) shown in FIG. 8 is the temperature of the wafer 200 in the dry processing step (S40). According to FIG. 8, when the temperature in the dry processing step (S40) is set to 150° C., it is found that the number of particles can be reduced to ¼ or less, compared with a case that the temperature of the dry processing step (S40) is set to 80° C.

(b) By performing the dry processing step (S40), impurities such as ammonia, ammonium chloride, carbon, hydrogen, and the outgas caused by the solvent, can be separated from the wafer 200.

(c) By performing the dry processing step (S40), the impurities separated from the wafer 200 can be prevented from re-adhering to the wafer 200.

(d) In the dry processing step (S40), the wafer 200 can be dried while preventing the re-adhesion of the impurities to the wafer 200.

(e) By performing the dry processing step (S40) at a higher temperature than the temperature (first temperature) in the reform processing step (S30) and at a temperature of not more than the processing temperature in the pre-baking step (T30), an influence on the SiO film due to thermal damage or thermal budget (thermal history) can be reduced.

(f) By performing the dry processing step (S40) at a higher temperature than the temperature (first temperature) in the reform processing step (S30) and at a temperature of not more than the processing temperature in the pre-baking step (T30), variation of the dielectric constant of the SiO film can be reduced. That is, a desired dielectric constant can be maintained.

(g) By performing the dry processing step (S40) at a higher temperature than the temperature (first temperature) in the reform processing step (S30) and at a temperature of not more than the processing temperature in the pre-baking step (T30), reproducibility of the dielectric constant of the SiO film can be improved.

(h) By performing the dry processing step (S40) at a higher temperature than the temperature (first temperature) in the reform processing step (S30) and at a temperature of not more than the processing temperature in the pre-baking step (T30), film density of the SiO film can be maintained in a desired density.

(i) By performing the dry processing step (S40) at a higher temperature than the temperature (first temperature) in the reform processing step (S30) and at a temperature of not more than the processing temperature in the pre-baking step (T30), reproducibility of the film density of the SiO film can be improved.

(j) By slowly drying the wafer 200 in the dry processing step (S40), uniform dry processing can be applied to each of the plurality of wafers 200 accommodated in the processing vessel 203.

(k) By vacuum-exhausting the inside of the processing vessel 203 in a state that the temperature in the processing vessel 203 is maintained after the dry processing step (S40), the particles and the impurities remained in the processing vessel 203 can be removed.

(l) By returning the pressure in the processing vessel 203 to the atmospheric pressure while maintaining the temperature after vacuum-exhaustion and increasing the thermal capacity in the processing vessel 203, the temperature of the wafer 200 can be raised, and the particles that cannot be removed by the vacuum-exhaustion or the outgas, etc., can be further removed from the wafer 200.

(m) By increasing the concentration of the hydrogen peroxide which is the process liquid used in the reform processing step (S30), the number of the particles can be further suppressed. The "standard product" shown in FIG. 8 means the use of a standard hydrogen peroxide solution containing 10 ppm or less of acid and 0.3 ppm or less of chloride, and a "high purity product" means the use of the hydrogen peroxide solution with high purity containing 5 ppm or less of acid and 0.02 ppm or less of chloride. According to FIG. 8, when the high purity product is used in the reform processing step (S30), it is found that the number of particles can be reduced to about ½ or less even under the same temperature condition, compared with a case that the standard product is used.

(n) According to FIG. 8, when the upper part (TOP), the central part (CNT), and the lower part (BTM) of the processing vessel 203 are compared, and when the high purity product is used, it is found that the number of particles can be reduced and the uniformity of the processing among wafers 200 can be improved in the case of the TOP.

(o) By adjusting a supply ratio of the hydrogen peroxide solution supplied into the processing vessel 203, and the oxygen-containing gas in the reform processing step (S30), the film density can be controlled.

(p) By adjusting a supply ratio of the hydrogen peroxide solution supplied into the processing vessel 203, with respect to the oxygen-containing gas in the reform processing step (S30), generation of the particles can be suppressed.

(q) By temporarily purging the inside of the processing vessel 203 in a medium vacuum state when performing vacuum-exhaustion in the cooling/atmospheric pressure returning step (S60), the impurities can be efficiently removed.

<Other Embodiment of the Present Invention>

As described above, embodiments of the present invention have been described specifically. However, the present invention is not limited to the abovementioned embodiments, and can be variously modified in a range not departing from the gist of the invention.

In the abovementioned embodiments, explanation is given for a case that the hydrogen peroxide gas is used as the process gas. However, the present invention is not limited thereto. That is, when a gas obtained by vaporizing a solution (reactant in a liquid state) in which a source (reactant) which is a solid state or a liquid state at a normal temperature, is used as the process gas, the present invention is not limited to the case of using the hydrogen peroxide gas, but can be suitably applied to other case. Further, if the vaporization point of the source (reactant) is different from the vaporization point of the solvent, the effect of the abovementioned embodiments can be easily obtained. Also, the vaporization gas which is the process gas, is not limited to a gas in which the concentration of the source becomes high when re-liquefaction occurs, but may be a gas in which the concentration of the source becomes low when re-liquefaction occurs. Even in the case of such a process gas, by performing the processing in the same processing procedure as the procedure of the abovementioned embodiment using the abovementioned substrate processing apparatus, the concentration of the process gas in the processing vessel can be made uniform, and the in-plan uniformity of the substrate in the reform processing and the uniformity among substrates can be respectively improved.

Further, a steam ($H_2O$) gas, etc., obtained by causing a reaction among a gas containing a hydrogen element (H) such as a hydrogen ($H_2$) gas (hydrogen-containing gas), a gas containing an oxygen element (O) such as an oxygen ($O_2$) gas (oxygen-containing gas), may be used as the process gas, other than the hydrogen peroxide gas. Also, steam generated by heating the water ($H_2O$) can be used as the process gas. For example, ozone ($O_3$) gas or the steam ($H_2O$), etc., may be used as the oxygen-containing gas, other than the $O_2$ gas. However, when compared with the steam (water, $H_2O$), the hydrogen peroxide has a characteristic of having a high activation energy and having a large number of oxygen atoms contained in one molecule, and therefore having a strong oxidizing power. Therefore, when the hydrogen peroxide gas is used as the process gas, this is advantageous in a point that the oxidation processing can be performed up to a deep portion (bottom portion of the groove) of the film formed in the groove on the substrate surface. Also, when the hydrogen peroxide gas is used as the process gas, the reform processing step can be performed at a low temperature of 40° C. to 150° C., and this is advantageous in a point that performance deterioration, etc., of the circuit element made of a material (for example, aluminum) which is weak particularly for high temperature processing, can be suppressed.

When the hydrogen peroxide gas is used as the process gas, the process gas may be set in a $H_2O_2$ molecular single state or a cluster state in which several molecules are bonded to each other. Further, when the hydrogen peroxide gas is generated, the hydrogen peroxide solution may be vaporized and decomposed to the $H_2O_2$ molecular single body, or may be decomposed to a cluster state in which several molecules are bonded to each other. Also, a gas in a mist state formed by gathering of the abovementioned several clusters, may be used as the process gas.

Further, when the gas obtained by vaporizing the water ($H_2O$) (steamed gas) is used as the process gas, the single body state of the $H_2O$ molecule alone or the cluster state in which several molecules are bonded to each other, may be contained in the process gas. When the water ($H_2O$) is vaporized in a gas state, it may be decomposed into the $H_2O$ molecular single body, or may be decomposed in the cluster state in which several molecules are maintained in a bonded state. Also, the gas in the mist state formed by gathering of the abovementioned several clusters, may be used as the process gas.

The abovementioned embodiment shows an example of processing a substrate having the polysilazane film formed thereon. However, the present invention is not limited thereto. That is, when processing the substrate with the film having the silazane bond (—Si—N—) formed thereon, the similar effect as the abovementioned embodiment can be obtained, even if the film is not the polysilazane film.

Also, the abovementioned embodiment shows an example of processing the polysilazane film formed by performing the PHPS coating step and the pre-baking step. However, the present invention is not limited thereto. For example, even in a case of processing the Si-containing film formed by the CVD method and not subjected to pre-bake, the similar effect as the effect of the abovementioned embodiment can be obtained.

Further, in the abovementioned processing furnace 202, external temperature sensors 264a to 264d (see FIG. 2) may be installed outside of the processing vessel 203, as temperature detectors for detecting each temperature of the heater units 207a to 207d included in the first heating unit 207.

Further, an annealing step (heat treatment step) for heating the wafer 200 at a high temperature of 800° C. to 1000° C. may be performed between the dry processing step (S40) and the cooling/atmospheric pressure returning step (S60). In this case, as described above, a cooling gas is preferably supplied into the space 260 in the cooling/atmospheric pressure returning step (S60). Thus, the processing vessel 203 and the first heating unit 207 can be cooled in a short time, and a start time of the next reform processing step (S30) can be set to be earlier, and the manufacturing throughput can be improved.

In the abovementioned embodiment, the substrate processing apparatus including a vertical processing furnace has been described. However, the present invention is not limited thereto, and can be suitably applied to a substrate processing apparatus having single-wafer type, Hot Wall type, or Cold Wall type processing furnace, or a substrate processing apparatus for processing the wafer 200 by exciting the process gas.

Further, the abovementioned embodiment shows an example of generating the hydrogen peroxide gas which is the process gas, in the processing vessel 203. However, the present invention is not limited thereto. For example, the hydrogen peroxide gas which is previously vaporized outside of the processing vessel 203, may be supplied into the processing vessel 203.

Figure 9:
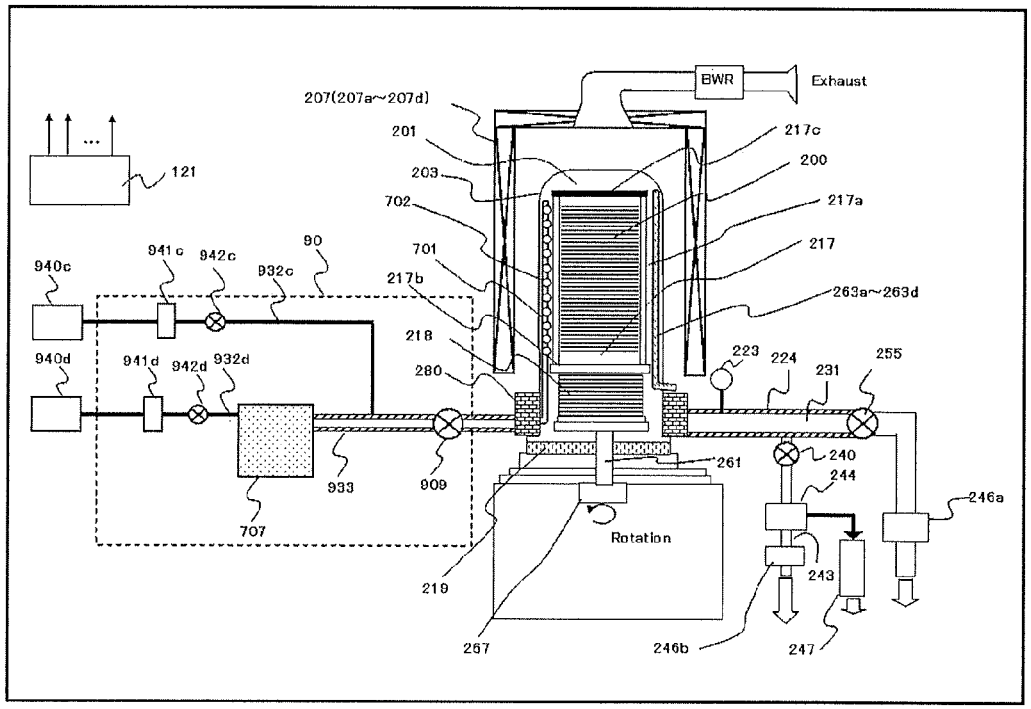
FIG. 9 is a schematic block diagram of a substrate processing apparatus according to other embodiment of the present invention.

FIG. 9 is a schematic block diagram of the substrate processing apparatus according to other embodiment of the present invention. In the substrate processing apparatus shown in FIG. 9, the hydrogen peroxide gas which is the process gas is generated outside of the processing vessel 203, and is supplied into the processing vessel 203. In FIG. 9, the same signs and numerals are assigned to structures in common with those of the first embodiment.

As shown in FIG. 9, a gas supply nozzle 701 is arranged in the processing vessel 203 along an arrangement direction of the wafers 200. A plurality of gas supply holes 701 are formed on a side portion of the gas supply nozzle 701 so as to correspond to each of the wafers 200. A gas supply pipe 933 is connected to the upstream end of the gas supply nozzle 701, for supplying the hydrogen peroxide gas. A hydrogen peroxide gas generator 707 and an automatic valve 909, are provided on the gas supply pipe 933 sequentially from the upstream side. A hydrogen peroxide solution supply pipe 932d is connected to the hydrogen peroxide gas generator 707. A hydrogen peroxide solution source 940d, a liquid flow controller (LMFC) 941d, and an automatic valve 942d are provided on the hydrogen peroxide solution supply pipe 932d sequentially from the upstream side. Also, an inert gas supply pipe 932c is connected to the gas supply pipe 933, for supplying an inert gas such as $N_2$ gas, etc. An inert gas supply source 940c, MFC 941c, and a valve 942c are provided on the inert gas supply pipe 932c sequentially from the upstream side.

A hydrogen peroxide gas supply system 90 is mainly constituted of the gas supply pipe 933, the hydrogen peroxide gas generator 707, the hydrogen peroxide solution supply pipe 932d, the automatic valves 933 and 942d, and LMFC 941d. The gas supply nozzle 701 and the hydrogen peroxide solution source 940d may be included in the hydrogen peroxide gas supply system. Also, an inert gas supply system is mainly constituted of the inert gas supply pipe 932c, MFC 941c, and the valve 942c. The inert gas supply source 940c may be included in the inert gas supply system. Also, the inert gas supply system may be included in the hydrogen peroxide gas supply system 90.

When the substrate processing apparatus shown in FIG. 9 is used in the reform processing step (S30), the automatic valve 942d is opened, to thereby supply the hydrogen peroxide solution with flow rate adjusted by the LMFC 941d, to the hydrogen peroxide gas generator 707. Then, the hydrogen peroxide gas is generated by vaporizing the hydrogen peroxide solution by the hydrogen peroxide gas generator 707. In this state, by opening the automatic valve 909, the hydrogen peroxide gas can be supplied into the processing vessel 203 through the gas supply nozzle 701, that is, can be supplied to the wafer 200.

However, when the substrate processing apparatus shown in FIG. 9 is used, re-liquefaction occurs in some cases, when the hydrogen peroxide gas passes through the gas supply pipe 933 and the gas supply nozzle 701. Particularly, the hydrogen peroxide gas is accumulated and re-liquefied at a curved (bent) portion or a joint, etc., of the gas supply pipe 933 and the gas supply nozzle 701. As a result, inside of the gas supply pipe 933 and inside of the gas supply nozzle 701 are sometimes damaged by the liquid generated by the re-liquefaction of the hydrogen peroxide gas in the gas supply pipe 933 or the gas supply nozzle 701. Therefore, it is necessary to heat the gas supply pipe 933 and the gas supply nozzle 701 by providing a heater thereto. On the other hand, in the abovementioned first embodiment, the hydrogen peroxide is supplied into the processing vessel 203 in the liquid state, and this is preferable in the point of not requiring the heater.

<Preferable Aspects of the Present Invention>

Preferable aspects of the present invention will be supplementarily described hereafter.

<Supplementary Description 1>

According to a first aspect, there is provided a substrate processing method, including:

(a) loading a substrate into a processing vessel having a pre-baked film containing a silazane bond;

(b) heating the substrate to a first temperature and supplying a process gas to the heated substrate; and (c) heating the substrate to which the process gas has been supplied, to a second temperature which is higher than the first temperature and less than or equal to a temperature at which the pre-bake has been performed.

<Supplementary Description 2>

According to a second aspect, there is provided the substrate processing method of the supplementary description 1, further including:

(d) supplying a process liquid into the processing vessel; and (e) generating the process gas by vaporizing the process liquid using a vaporizer in the processing vessel.

<Supplementary Description 3>

According to a third aspect, there is provided the substrate processing method of the supplementary description 1, wherein an oxygen-containing gas is supplied to the substrate at a first flow rate in (b), and the oxygen-containing gas is supplied thereto at a second flow rate larger than the first flow rate before (c).

<Supplementary Description 4>

According to a fourth aspect, there is provided the substrate processing method of the supplementary descriptions 1, further including:

(f) vacuum-exhausting the inside of the processing vessel after (c); and (j) returning the inside of the processing vessel to an atmospheric pressure after (f).

<Supplementary Description 5>

According to a fifth aspect, there is provided the substrate processing method of the supplementary description 1, wherein the process gas is a hydrogen peroxide gas.

<Supplementary Description 6>

According to a sixth aspect, there is provided a method of manufacturing a semiconductor device, including:

(a) loading a substrate into a processing vessel having a pre-baked film containing a silazane bond, with pre-bake performed to this film;

(b) applying reform processing to the substrate by heating the substrate to a first temperature and supplying a process gas to the substrate; and (c) heating the substrate to a second temperature which is higher than the first temperature and less than or equal to a temperature at which the pre-bake has been performed.

<Supplementary Description 7>

According to a seventh aspect, there is provided the method of manufacturing a semiconductor device, further including:

(d) supplying a process liquid into the processing vessel: and (e) generating the process gas by vaporizing the process liquid using a vaporizer in the processing vessel.

<Supplementary Description 8>

According to an eighth aspect, there is provided a substrate processing apparatus, including:

a processing vessel accommodating a substrate having a pre-baked film containing a silazane bond;

a process gas supplying unit supplying a process gas to the substrate;

a heating unit heating the substrate;

a control unit configured to control the process gas supplying unit and the heating unit to modify the pre-baked film containing a silazane bond by heating the substrate to a first temperature and supplying the process gas to the substrate and subsequently heat the substrate to a second temperature which is higher than the first temperature and less than or equal to a temperature at which the pre-bake has been performed.

<Supplementary Description 9>

According to a ninth aspect, there is provided the substrate processing apparatus of the eighth aspect, further including:

a process liquid supplying unit supplying a process liquid into the processing vessel; and a vaporization unit generating a process gas by vaporizing the process liquid in the processing vessel.

<Supplementary Description 10>

According to a tenth aspect, there is provided a non-transitory computer-readable recording medium recording a program for causing a computer to execute:

a procedure of loading a substrate into a processing vessel having a pre-baked film containing a silazane bond, with pre-bake performed to this film;

a procedure of heating the substrate to a first temperature and supplying a process gas to the heated substrate; and a procedure of heating the substrate to which the process gas has been supplied, to a second temperature which is higher than the first temperature and less than or equal to a temperature at which the pre-bake has been performed.

<Supplementary Description 11>

According to an eleventh aspect, there is provided the non-transitory computer-readable recording medium recording a program for causing a computer to execute:

a procedure of supplying a process liquid into the processing vessel: and a procedure of generating the process gas by vaporizing the process liquid using a vaporizer in the processing vessel.

DESCRIPTION OF SINGS AND NUMERALS

200 Wafer (substrate)
203 Processing vessel (reaction tube)
217 Boat
217*d* Vaporizer (vaporization unit)
219 Seal cap
207 First heating unit
280 Second heating unit
300 Liquid flow control unit
501 Process liquid supply nozzle
502 Supply hole (process liquid supplying unit)
231 Gas exhaust pipe
121 Controller (control unit)

The invention claimed is:

1. A substrate processing method, comprising:
   (a) loading a substrate into a processing vessel having a pre-baked film containing a silazane bond;
   (b) heating the substrate to a first temperature and supplying a process gas to the heated substrate, thereby modifying the film containing the silazane bond; and
   (c) heating the substrate to which the process gas has been supplied, to a second temperature which is higher than the first temperature and less than or equal to a temperature at which the pre-bake has been performed.

2. The substrate processing method according to claim 1, further comprising:
   (d) supplying a process liquid into the processing vessel; and
   (e) generating the process gas by vaporizing the process liquid using a vaporizer in the processing vessel.

3. The substrate processing method according to claim 1, wherein an oxygen-containing gas is supplied to the substrate at a first flow rate in (b), and the oxygen-containing gas is supplied thereto at a second flow rate larger than the first flow rate before (c).

4. The substrate processing method according to claim 1, further comprising:
   (f) vacuum-exhausting the inside of the processing vessel after (c); and
   (j) venting the inside of the processing vessel to an atmospheric pressure after (f).

5. The substrate processing method according to claim 1, wherein the process gas is a hydrogen peroxide gas.

\* \* \* \* \*